June 7, 1966 J. H. KNAPTON ET AL 3,255,419

WIDE BAND AMPLIFIER CIRCUIT HAVING CURRENT AMPLIFIER INPUT STAGE AND OPERATIONAL AMPLIFIER OUTPUT STAGE

Filed June 18, 1963 2 Sheets-Sheet 1

INVENTORS
JAMES H. KNAPTON
OLIVER DALTON
BY
BUCKHORN, BLORE,
KLARQUIST & SPARKMAN
ATTORNEYS

INVENTORS
JAMES H. KNAPTON
OLIVER DALTON
BY
BUCKHORN, BLORE,
KLARQUIST & SPARKMAN
ATTORNEYS

United States Patent Office 3,255,419

Patented June 7, 1966

3,255,419

WIDE BAND AMPLIFIER CIRCUIT HAVING CURRENT AMPLIFIER INPUT STAGE AND OPERATIONAL AMPLIFIER OUTPUT STAGE

James H. Knapton and Oliver Dalton, Beaverton, Oreg., assignors to Tektronix, Inc., Beaverton, Oreg., a corporation of Oregon Filed June 18, 1963, Ser. No. 288,727
9 Claims. (Cl. 330—14)

Figure 1:
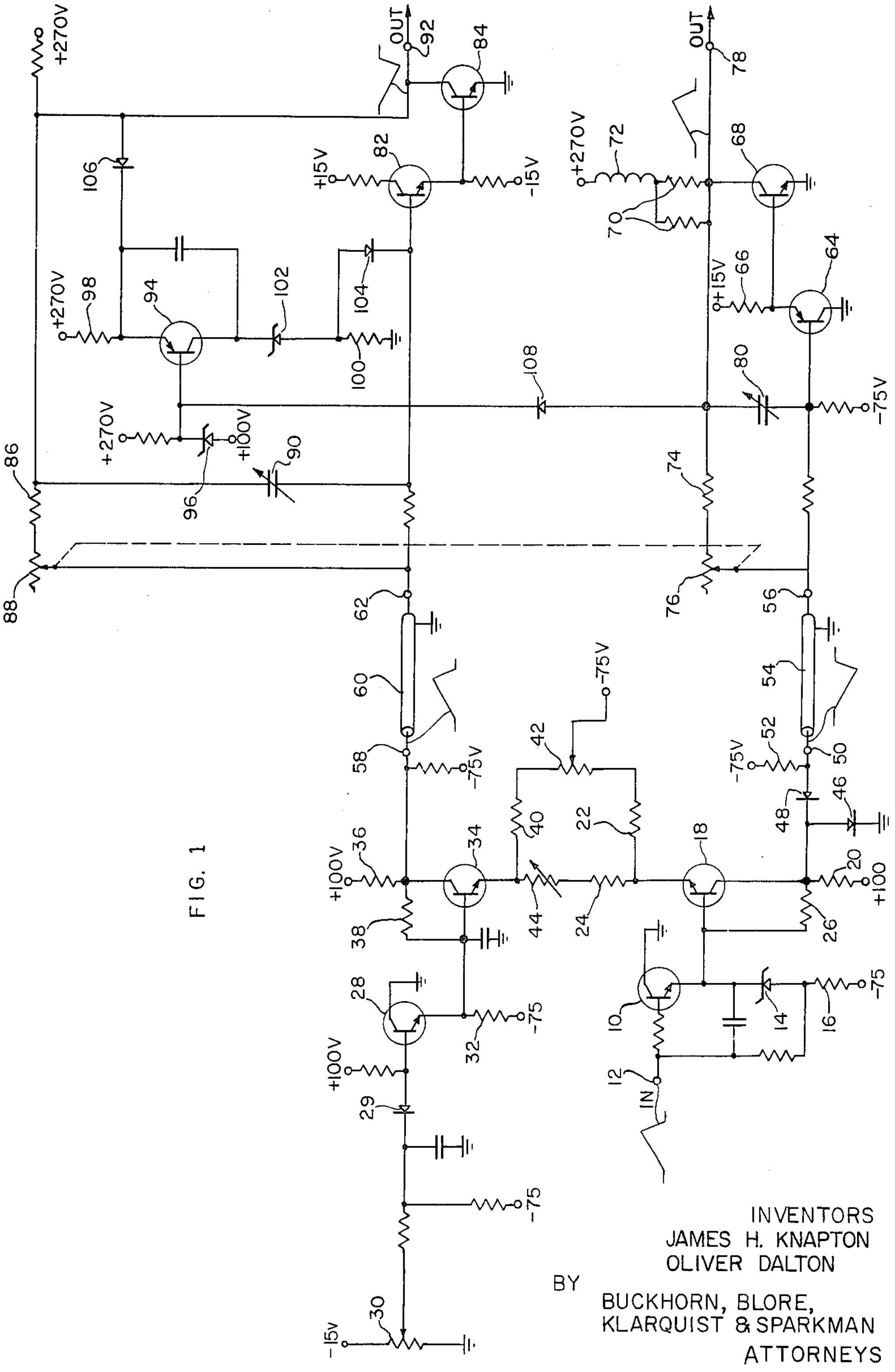

The subject matter of the present invention relates generally to electrical signal amplifiers, and in particular to a wide band amplifier circuit having a current amplifier input stage and an operational amplifier output stage which may be interconnected by a low impedance transmission line in order to transmit a current signal from the output of such current amplifier through the transmision line to the input of such operational amplifier with substantially no distortion over a wide range of frequencies. In a preferred embodiment of the present invention the current amplifier is a voltage to current or transadmittance amplifier which may be in the form of an improved paraphase amplifier to provide push-pull current output signals. The outputs of the paraphase amplifier are connected through a pair of transmission lines to the inputs of two operational amplifiers which may be provided with voltage limiting diodes to prevent saturation or cutoff of the output transistors of such operational amplifiers. The operational amplifier may include a voltage inverter amplifier having a high internal gain and negative voltage feedback so that the voltage on the input terminal of the operational amplifier remains substantially constant and the overall gain of such operational amplifier is determined by the ratio of the feedback impedance to the input coupling impedance.

The wide band amplifier circuit of the present invention is particularly useful when used as the horizontal amplifier of a cathode ray oscilloscope to supply push-pull sweep signals to the horizontal deflection plates of such oscilloscope. In order to provide an oscilloscope with versatility it is often desirable to employ a plurality of different vertical and horizontal preamplifiers in the form of plug-in units in combination with the main vertical and horizontal amplifiers which are permanently mounted in the chassis of the oscilloscope. Previous amplifier circuits of this type have caused signal wave form distortion due to stray capacitance as a result of the transmission of voltage signals from the preamplifier through the usual high impedance connections between the preamplifier and the main output amplifier. However, the wideband amplifier circuit of the present invention avoids such signal wave form distortion by converting the voltage input signals to current signals in a transadmittance amplifier and transmitting such current signals through a low impedance coaxial cable to an operational amplifier. The use of a low impedance coaxial cable having a characteristic impedance in the neighborhood of 50 ohms means that the stray capacitance in parallel with such cable connection must be extremely high before it causes any appreciable distortion of the current signal wave form.

The operational amplifier output stage of the present amplifier circuit compensates for transistor parameter variations and has a minimum of frequency compensation adjustments to provide an improved horizontal amplifier which may employ two operational amplifiers to provide push-pull horizontal sweep signals. The paraphase amplifier input stage of the amplifier circuit may include feedback to reduce the gain of one side of such amplifier in order to balance the amplitudes of the two output signals of the paraphase amplifier. This is accomplished in one embodiment of the present transadmittance paraphase amplifier by means of an emitter follower transistor connected in cascade with each of the emitter coupled transistors of such paraphase amplifier so that a feedback signal is transmitted from the collector to the emitter of each of the emitter coupled transistors through one of the emitter follower transistors.

It is therefore one object of the present invention to provide an improved electrical amplifier circuit having substantially no signal wave form distortion over a wide range of frequencies.

Another object of the invention is to provide an improved wide band amplifier circuit having a current amplifier input stage and an operational amplifier output stage which are interconnected by a low impedance transmission line to enable the transmisison of a current signal from such input stage to such output stage without wave form distortion.

A further object of the present invention is to provide an improved push-pull amplifier circuit having a transadmittance paraphase amplifier input stage and a pair of operational amplifier output stages connected to the outputs of such paraphase amplifier through a pair of low impedance coaxial cables or other transmission lines to provide a push-pull amplifier which has a minimum of frequency compensation adjustments and which compensates for transistor parameter variations.

Still another object of the invention is to provide an improved operational amplifier having a voltage limiting feedback circuit to prevent the output transistor of such operational amplifier from being rendered nonconducting.

An additional object of the invention is to provide an improved paraphase amplifier which produces balanced output signals of substantially the same amplitude over a wide range of frequencies.

Figure 2:
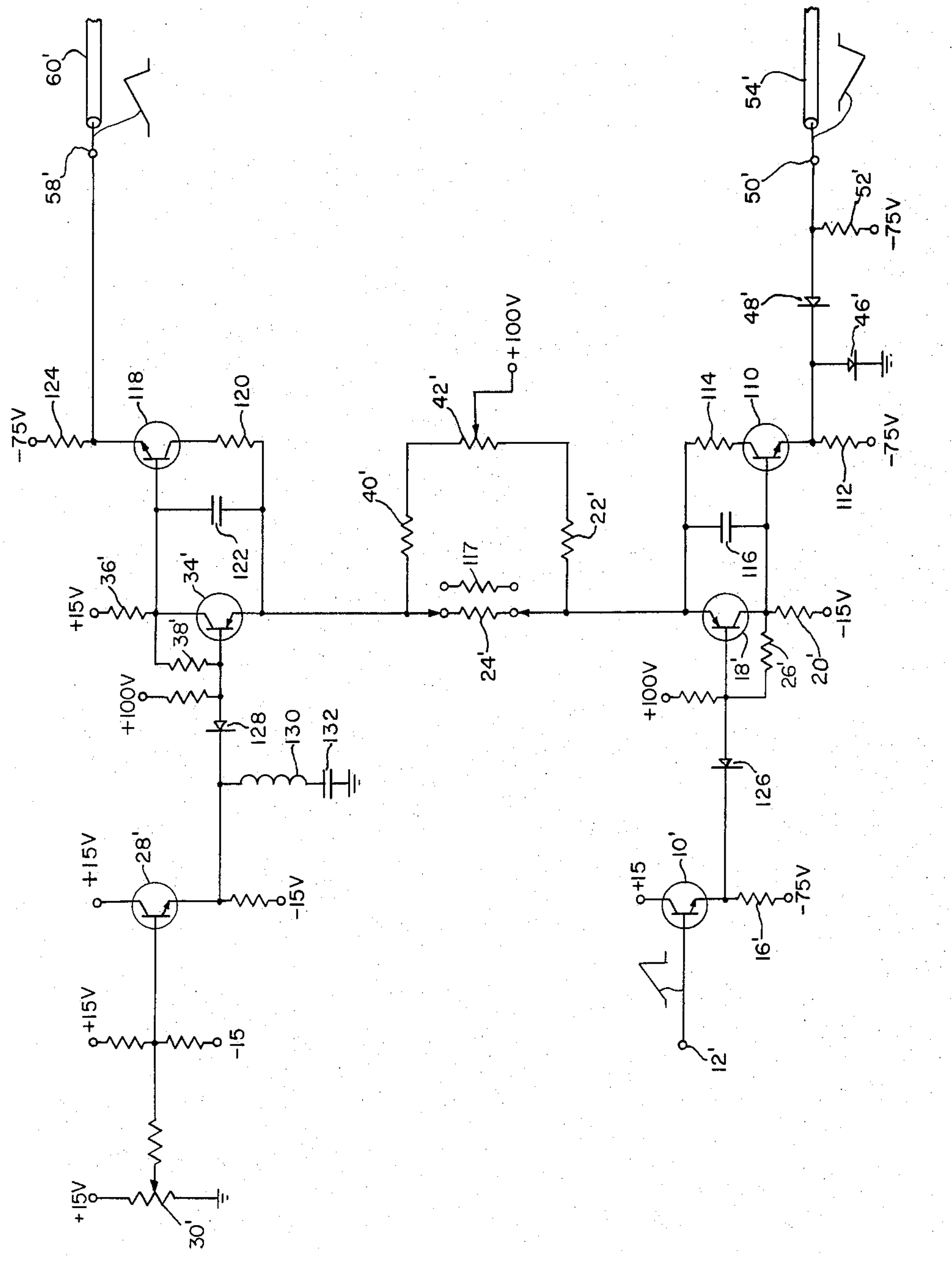

Other objects of the present invention and advantages will be apparent from the following detailed description of certain preferred embodiments thereof and from the attached drawings of which:

FIG. 1 is a schematic diagram of one embodiment of the amplifier circuit of the present invention; and FIG. 2 is a schematic diagram of another embodiment of the paraphase amplifier employed as the input stage of the amplifier circuit shown in FIG. 1.

As shown in FIG. 1 the wide band horizontal amplifier circuit of the present invention may have a transadmittance paraphase amplifier input stage including an input transistor 10 which may be of an NPN type, connected as an emitter follower amplifier with its base connected to the input terminal 12 of such paraphase amplifier. The emitter of input transistor 10 is connected to a source of negative D.C. bias voltage through a zener diode 14 and a load resistor 16. The emitter of the input transistor 10 is connected to the base of the transistor 18 which may be of an NPN type connected as a common emitter amplifier. The collector of the output transistor 18 may be connected to a source of positive D.C. bias voltage through a collector resistor 20 and its emitter is connected to a common emitter impedance. The common emitter impedance includes a bias resistor 22 connected to a negative D.C. bias voltage and a fixed coupling resistor 24. The transistor 18 is provided with a shunt resistor 26 connected from the collector to the base of such transistor. Since the A.C. load impedance of the transistor 18, including a coaxial cable 54 and its output termination, is low the output voltage at terminal 50 remains substantially constant and the shunt resistor 26 does not provide negative voltage feedback for such transistor. Instead the shunt resistor functions to provide negative current "feed-forward" by shunting a portion of the input signal applied to the base of transistor 18 around the collector junction of such transistor which reduces the current signal flowing into the coaxial cable 54 to balance the current signals transmitted from the paraphase amplifier.

A reference transistor 28 which may be of an NPN type has its base connected through a coupling diode 29 to a source of negative D.C. reference voltage which is produced across a reference potentiometer 30. The setting of the movable contact of the reference potentiometer 30 determines the horizontal position of the signal wave form on the fluorescent screen of the oscilloscope. The emitter of reference transistor 28 is connected to a source of negative D.C. bias voltage through a load resistor 32 so that such reference transistor is an emitter follower amplifier with its output connected to the base of a transistor 34. The transistor 34 may be of the NPN type and is connected as a common base amplifier, with a collector resistor 36 and a collector to base shunt resistor 38. The emitter of the transistor 34 is connected to the common emitter circuit of transistor 18 through the coupling resistor 24. A bias resistor 40 is connected between the emitter of the transistor 34 and a source of negative D.C. bias voltage through the movable contact of potentiometer 42 which balances the D.C. operating voltages of both of the transistors 18 and 34. A variable coupling resistor 44 is connected in series with the fixed coupling resistor 24 in order to vary the gain of the paraphase amplifier by changing the amount of coupling resistance between output transistors 18 and 34. The transistors 18 and 34 thus constitute the output transistors of the paraphase amplifier stage.

A voltage limiting diode 46 is connected between the collector of transistor 18 and ground to maintain the collector voltage of such transistor at zero volts or less. Also a coupling diode 48 has its cathode connected to the anode to the limiting diode 46 to transmit negative signals therethrough to the first output terminal 50 of the paraphase amplifier. Diodes 46 and 48 prevent the saturation of the output transistor of the operational amplifier connected to output terminal 50. The voltage drop across limiting diode 46 normally reversely biases the coupling diode 48 nonconducting for positive signals. Thus if output transistor 18 should be driven to cut off the positive going voltage on its collector is not transmitted through coupling diode 48 and does not cause the output transistor of the first operational amplifier to saturate. However, a negative output signal forwardly biases such coupling diode and renders it conducting. This connects a source of negative D.C. bias voltage to the collector of transistor 18 through a load resistor 52 to enable the voltage of output terminal 50 to be driven negative and to produce a negative ramp sweep signal.

The first output terminal 50 of the paraphase amplifier is connected through the inner conductor of a first coaxial cable 54 of low characteristic impedance on the order of 50 to 100 ohms, to the input terminal 56 of a first operational amplifier. Likewise, a second output terminal 58 of the paraphase amplifier at the collector of the second output transistor 34 is connected through the inner conductor of a second coaxial cable 60 of low characteristic impedance to the input terminal 62 of a second operational amplifier. The first operational amplifier may include an input transistor 64 of the PNP type, connected as an emitter follower amplifier with its emitter connected to a source of positive D.C. bias voltage through a load resistor 66. The base of the input transistor 64 is connected to the input terminal 56, while the emitter of such transistor is connected to the base of an output transistor 68 so that the negative sweep signal transmitted through cable 54 is applied to the input terminal of the output transistor 68. The output transistor 68 may be an NPN type transistor which is connected as a common emitter amplifier having a high voltage gain. Thus a positive voltage signal applied to the base of such output transistor could drive it to saturation except for the presence of limiting diodes 46 and 48. It is possible that the positive going retrace portion of the sweep signal applied to the base of the output transistor 68 of the operational amplifier could drive such transistor to saturation and this is prevented by such limiting diodes. Of course, if the output transistor 68 were driven to saturation the wave form of the subsequent output sweep signal produced on output terminal 78 would be considerably distorted due to charge storage in such transistor. The collector of output transistor 68 is connected to a source of positive D.C. bias voltage through a pair of parallel load resistors 70 and a peaking inductance coil 72. A fixed feedback resistor 74 is connected from the collector of output transistor 68 to the input terminal 56 of the operational amplifier through a variable feedback resistor 78 in order to provide negative voltage feedback from the output to the input of the operational amplifier. This enables the voltage at the input terminal 56 to remain substantially constant while the output voltage produced on the output terminal 78 of the operational amplifier varies to provide a positive sweep signal. A variable capacitor 80 is connected from the collector of output transistor 68 to the base of input transistor 64 for high frequency compensation purposes and is the only such adjustment in the first operational amplifier.

The second operational amplifier is similar to the first operational amplifier previously described so that only the differences will be described in detail. This operational amplifier includes an input transistor 82 connected as an emitter follower amplifier whose output is connected to the input of an output transistor 84 connected as a common emitter amplifier. The collector of output transistor 84 is connected through a fixed feedback resistor 86 and a variable feedback resistor 88 to the input terminal 62 of such operational amplifier to provide negative voltage feedback. In a similar manner to the first operational amplifier, the output transistor 84 provides a high voltage gain to maintain the input voltage of such operational amplifier substantially constant and provide it with a low input impedance. A variable frequency compensation capacitor 90 is connected from the collector of output transistor 84 to the base of input transistor 82. However, the second operational amplifier is also provided with a voltage limiting circuit in order to prevent the output transistor 84 from being driven into cut-off. This is necessary because the first and second operational amplifiers are employed to provide a push-pull sweep signal to the horizontal reflection plates of the oscilloscope. Thus a positive sweep signal is transmitted through cable 60 and applied to base of transistor 84 which inverts such signal so that it appears as a negative sweep signal on the output terminal 92 of the second operational amplifier. The limiting circuit includes a control transistor 94 of a PNP type connected as a common base amplifier whose base is connected to a source of substantially constant positive D.C. reference voltage produced across the zener diode 96 which is always conducting. The emitter of the control transistor is connected to a source of positive D.C. bias voltage through a load resistor 98 while the collector of such transistor is connected to ground through a load resistor 100 and a zener diode 102. A limiting diode 104 is connected by its anode to the anode of the zener diode 102 and by its cathode to the base of input transistor 82. This limiting diode is normally biased non-conducting by the emitter to collector current flow through transistor 94 since this produces a voltage drop of about +0.2 volt across resistor 100. The voltage drops across the emitter junctions of transistors 82 and 84 provide a D.C. bias voltage of +1.2 volts on the cathode of such limiting diode so that the limiting diode 104 is non-conducting.

A limiting diode 106 is also connected from the collector of output transistor 84 to the emitter of control transistor 94. Since the zener diode 96 sets a base voltage of control transistor 94 at approximately +115 volts and the collector of output transistor 84 may be quiescently biased from +10 volts to about +100 volts, the limiting diode 106 is normally non-conducting and in one bias condition is reversely biased by about 15 volts. As long as this reverse bias condition persists only the current through the resistor 98 and the control transistor 94 is employed to establish the bias voltage on limiting diode 104. However, if the positive going retrace portion of such sweep signal overshoots to +116 volts, the limiting diode 106 is rendered conducting. Any further rise in the collector voltage of output transistor 84 causes an increase in current through diode 106 and control transistor 94 to increase the voltage drop across load resistor 100. This increased voltage drop tends to forward bias the diode 104 and applies a positive voltage feedback signal to the base of input transistor 82. This feedback signal is transmitted from the emitter of input transistor 82 to the base of the output transistor 84 and tends to render such output transistor conducting to prevent its collector voltage from going more positive. As a result the output transistor 84 is prevented from being cut off and the collector voltage of such output transistor is maintained below an upper limit voltage slightly greater than +115 volts to prevent destruction of the transistor. This also eliminates the signal distortion which is caused by this condition so that starting time of a subsequent sweep signal at output terminal 92 is not delayed by having to drive such transistor out of cut-off. Another voltage limiting diode 108 is connected from the collector of the output transistor 68 of the first operational amplifier to the cathode of zener diode 96. This limiting diode 108 limits the maximum voltage which can be produced on the collector of output transistor 68 to approximately +116 volts and prevents the ramp portion of the output sweep signal on output terminal 78 from exceeding this figure and possibly destroying such output transistor.

Another embodiment of a paraphase amplifier which may be employed in the amplifier circuit of FIG. 1, is shown in FIG. 2. This paraphase amplifier circuit is similar to that shown in FIG. 1 so that similar components have been designated by the same reference number and only the differences between the two circuits will be described in detail. Thus, the transistor 18' may be of the PNP type connected as a common emitter amplifier whose collector is connected to the base of a transistor 110 which is connected as an emitter follower amplifier to provide a cascade transadmittance amplifier. The emitter follower transistor 110 may be an NPN type transistor whose emitter is connected to a source of negative D.C. bias voltage through a load resistor 112 and whose collector is connected to the emitter of transistor 18' through an oscillation suppressor resistor 114. A shunt capacitor 116 is connected from the base of transistor 110 to the emitter of transistor 18' to cooperate with resistor 114 in the prevention of oscillation. The emitter follower transistor 110 increases the input impedance of the amplifier including transistor 18' but reduces the effective emitter junction impedance of each transistor from about 5.0 ohms to approximately 0.3 ohm or less so that there is less variation of emitter to base voltage. This enables the use of a fixed emitter coupling resistance and allows the gain of the paraphase amplifier stage to be increased by a fifty times magnification merely by switching, for example, from a first resistor 24' of 2,500 ohms to a second emitter coupling resistor 117 of 50 ohms, without adjustment of a variable resistor similar of resistor 44 of FIG. 1. In addition, the output impedance of the cascade transadmittance amplifier including transistor 18' and 110 is approximately equal to resistor 112. Another emitter follower amplifier transistor 118 is connected by its base to the collector of common base amplifier transistor 34' and by its collector to the emitter of such transistor 34' to function in similar manner to transistor 110. Thus, transistor 118 may also be provided with a coupling resistor 120 and a shunt capacitor 122 to prevent oscillation and may be connected by its emitter to a source of negative D.C. bias voltage through a resistor 124 which is approximately equal to the output impedance of this second transadmittance amplifier. In addition a pair of overload disconnect diodes 126 and 128 may be connected from the emitters of transistors 10' and 28', respectively, to the bases of transistors 18' and 34' respectively. Also, another oscillation suppressor circuit including an inductor 130 and a bypass capacitor 132 may be connected from the emitter of transistor 38' to ground.

It will be obvious to those having ordinary skill in the art that various changes may be made in the details of the above-described embodiment of the present invention without departing from the spirit of the invention. Therefore, the scope of the invention should be determined by the following claims.

We claim:

1. An amplifier circuit, comprising:
a current amplifier connected as the input stage of said amplifier circuit;
an operational amplifier connected as the output stage of said amplifier circuit, said operational amplifier including a phase inverter amplifier and a feedback impedance connected between the output and input of said inverter amplifier to provide direct current negative feedback for said operational amplifier; and
a transmission line of low substantially uniform characteristic impedance connected between the output of said current amplifier and the input of said operational amplifier in order to transmit a current signal from the input stage to the output stage of said amplifier circuit with substantially no distortion over a wide range of frequencies, and such amplifier circuit being free at all times of any feedback connection from the output of said operational amplifier to the input of said current amplifier.

2. An amplifier circuit, comprising:
a voltage-to-current amplifier connected as the input stage of said amplifier circuit for changing a voltage input signal to a current output signal;
an operational amplifier connected as the output stage of said amplifier circuit;
said operational amplifier including a voltage inverter amplifier and having a feedback resistance connected from the output to the input thereof in order to provide direct current negative voltage feedback; and
a transmission line of low substantially uniform characteristic impedance connected between the output of said voltage-to-current amplifier and the input of said operational amplifier in order to transmit a current signal from the input stage to the output stage of said amplifier circuit with substantially no distortion over a wide range of frequencies.

3. A push-pull amplifier circuit, comprising:
a voltage-to-current amplifier having a push-pull output and connected as the input stage of said amplifier circuit;
a pair of operational amplifiers connected as the output stages of said amplifier circuit, each of said operational amplifiers including a voltage inverter amplifier and a feedback resistance connected between the output and input of said inverter amplifier to provide direct current negative voltage feedback for such operational amplifier; and
a pair of transmission lines of low substantially uniform characteristic impedance, a different one of said lines being connected between each of the outputs of said voltage-to-current amplifier and the inputs of said pair of operational amplifiers in order to transmit push-pull current signals from the input stage to the output stages of said amplifier circuit with substantially no distortion over a wide range of frequencies.

4. An amplifier circuit, comprising:
a push-pull amplifier including a pair of transistors having their emitters connected together with the base of one of said pair of transistors connected to the input terminal of said push-pull amplifier and the base of the other of said pair of transistors connected to a reference voltage;
said pair of transistors having their collectors connected to the output terminals of said push-pull amplifier to provide a push-pull output current signal;
a first operational amplifier including an input transistor connected as an emitter follower amplifier;
an output transistor connected as a common emitter amplifier having its input connected to the output of said input transistor;
a feedback impedance connected between the output of said output transistor and the input of said input transistor;
a first transmission line connected from the output of said one of said pair of transistors of said push-pull amplifier to the input of said first operational amplifier;
a second operational amplifier similar to said first operational amplifier; and
a second transmission line connected from the output of said other of said pair of transistors of said push-pull amplifier to the input of said second operational amplifier.

5. An amplifier circuit, comprising:
a paraphase amplifier including a pair of transistors having their emitters connected together with the base of one of said pair of transistors connected to the input terminal of said paraphase amplifier and the base of the other of said pair of transistors connected to a D.C. reference voltage;
a pair of shunt resistances connected from the collector to the base of said pair of transistors;
said pair of transistors having their collectors connected to the output terminals of said paraphase amplifier to provide a push-pull output current signal;
a first operational amplifier including an input transistor connected as an emitter follower amplifier;
an output transistor connected as a common emitter amplifier having its input connected to the output of said input transistor;
a feedback resistance connected from the output of said output transistor to the input of said input transistor;
a first transmission line connected from the output of said one of said pair of transistors of the paraphase amplifier to the input of said first operational amplifier;
a second operational amplifier similar to said first operational amplifier;
a second transmission line connected from the output of said other of said pair of transistors of said paraphase amplifier to the input of said second operational amplifier;
voltage limiting means connected to said operational amplifiers for preventing the output transistor of one of said operational amplifiers from being driven into nonconduction and for preventing the output transistor of the other of said operational amplifiers from being driven into saturation;
said voltage limiting means including a control transistor connected as a common base amplifier with its base connected to a D.C. reference voltage;
a first diode connected between the collector of the output transistor of one of said operational amplifiers and the emitter of said control transistor,
a second diode connected between the base of the input transistor of said one operational amplifier and the collector of the control transistor; and
a third diode connected between the base of said control transistor and the collector of the output transistor of the other of said operational amplifiers.

6. An amplifier circuit, comprising:
a paraphase amplifier including a pair of transistors having their emitters connected together with the base of one of said pair of transistors connected to the input terminal of said paraphase amplifier and the base of the other of said pair of transistors connected to a D.C. reference voltage;
a first transistor connected as an emitter follower amplifier with its base connected to the collector and its collector connected to the emitter of one of said pair of transistors;
a second transistor connected as an emitter follower amplifier with its base connected to the collector and its collector connected to the emitter of the other of said pair of transistors;
said first and second transistors having their emitters connected to the output terminals of said paraphase amplifier to provide a push-pull output current signal;
a first operational amplifier including an input transistor connected as an emitter follower amplifier;
an output transistor connected as a common emitter amplifier having its input connected to the output of said input transistor;
a feedback impedance connected from the output of sai output transistor tho the input of said input transistor;
a first transmission line connected from the output of said one of said pair of transistors of the paraphase amplifier to the input of said first operational amplifier;
a second operational amplifier similar to said first operational amplifier;
a second transmission line connected from the output of said other of said pair of transistors of said paraphase amplifier to the input of said second operational amplifier; and
voltage limiting means connected to the operational amplifiers for preventing the output transistor of one of said operational amplifiers from becoming saturated and for preventing the output transistor of the other of said operational amplifiers from being rendered nonconducting.

7. A push-pull amplifier, comprising:
a first input electron device having an emitting electrode, a collecting electrode and a control electrode and being connected as a signal voltage inverter amplifier with the control electrode of said first input device connected as an input for said push-pull amplifier;
a first shunt impedance connected between the control electrode and the collecting electrode of said first input device to provide negative current feed forward for said inverter amplifier;
a first output electron device connected as a signal voltage follower amplifier having its control electrode connected to the collecting electrode of said first input device and its collecting electrode connected to the emitting electrode of said first input device to provide a negative voltage feedback for said first input device;
a second input electron device connected as a signal voltage inverter amplifier with having its control electrode connected as an input for said push-pull amplifier and its emitting electrode connected to the emitting electrode circuit of said first input device;
a second shunt impedance connected to provide direct current coupling between the control electrode and the collecting electrode of said second input device;
a second output electron device connected as a signal voltage follower amplifier having its control electrode connected to the collecting electrode of said second input device and its collecting electrode connected to the emitting electrode of said second input device to provide a negative voltage feedback for said second input device.

8. A push-pull amplifier, comprising:

a first input transistor connected as a common emitter amplifier with the base of said input transistor connected to an input terminal of said push-pull amplifier;

a first shunt resistance connected to provide direct current coupling between the base and the collector of said first input transistor and to provide negative current feed forward for said common emitter amplifier;

a first output transistor connected as an emitter follower amplifier having its base connected to the collector of said first input transistor and its collector connected to the emitter of said first input transistor;

a second input transistor having its base connected to another input terminal and its emitter connected to the emitter circuit of said first input transistor;

a second shunt resistance connected to provide direct current coupling between the base and the collector of said second input transistor;

a second output transistor connected as an emitter follower amplifier having its base connected to the collector of said second input transistor and its collector connected to the emitter of said second input transistor.

9. A paraphase amplifier, comprising:

an input transistor connected as a common emitter amplifier with the base of said input transistor connected to the input of said paraphase amplifier;

a first shunt resistor connected between the base and collector of said input transistor to provide negative current feed forward for said common emitter amplifier;

a first output transistor connected as an emitter follower amplifier having its base connected to the collector of said input transistor and its collector connected to the emitter of said input transistor;

a reference transistor connected as a common base amplifier having its base connected to a D.C. reference voltage;

a second shunt resistor connected between the base and collector of said reference transistor;

a common emitter impedance including a plurality of fixed coupling resistors of different resistances and a selector switch for selectively connecting one of said coupling resistors between the emitters of said input transistor and said reference transistor for varying the gain of said paraphase amplifier in predetermined steps; and a second output transistor connected as an emitter follower amplifier having its base connected to the collector of said reference transistor and its collector connected to the emiter of said reference transistor.

References Cited by the Examiner

UNITED STATES PATENTS

| | | | |
|---|---|---|---|
| 2,210,503 | 8/1940 | Shaw | 330—120 X |
| 2,247,217 | 6/1941 | Braaten | 330—117 X |
| 2,762,874 | 9/1956 | Barco | 330—20 X |
| 2,968,716 | 1/1961 | Bearer et al. | 330—55 X |
| 2,990,516 | 6/1961 | Johannessen | 330—15 X |
| 3,032,704 | 5/1962 | Beck | 330—29 X |
| 3,153,152 | 10/1964 | Hoffman | 330—9 X |
| 3,153,202 | 10/1964 | Woolam | 330—9 |
| 3,168,656 | 2/1965 | Kobbe. | |

FOREIGN PATENTS

| | | |
|---|---|---|
| 560,983 | 7/1958 | Canada. |

OTHER REFERENCES

Sarbacher: Encyclopedic Dictionary of Electronics and Nuclear Engineering, Prentice-Hall 1959, page 1310 relied on.

ROY LAKE, *Primary Examiner.*

F. D. PARIS, *Assistant Examiner.*